United States Patent
Heid

(10) Patent No.: US 6,683,457 B2
(45) Date of Patent: Jan. 27, 2004

(54) MAGNETIC RESONANCE RESONATOR SYSTEM WITH COIL BRANCHES OPERABLE WITH A TIME-DELAY RELATIVE TO EACH OTHER

(75) Inventor: Oliver Heid, Gunzenhausen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/144,291

(22) Filed: May 13, 2002

(65) Prior Publication Data
US 2002/0180440 A1 Dec. 5, 2002

(30) Foreign Application Priority Data
Jun. 5, 2001 (DE) ......................... 101 27 266

(51) Int. Cl.[7] ................................................. G01V 3/00
(52) U.S. Cl. ...................................... 324/318; 324/322
(58) Field of Search .............................. 324/318, 322, 324/307, 309, 312

(56) References Cited

U.S. PATENT DOCUMENTS

| | | | | |
|---|---|---|---|---|
| 4,885,538 A | * | 12/1989 | Hoenniger et al. | 324/312 |
| 4,885,541 A | * | 12/1989 | Hayes | 324/322 |
| 4,947,121 A | * | 8/1990 | Hayes | 324/322 |
| 5,144,242 A | * | 9/1992 | Zeilenga et al. | 324/312 |
| 5,298,863 A | * | 3/1994 | Nowak et al. | 324/318 |
| 5,552,708 A | * | 9/1996 | Ham | 324/318 |
| 5,617,030 A | * | 4/1997 | Fischer et al. | 324/322 |
| 5,677,629 A | * | 10/1997 | Borsboom | 324/318 |
| 6,031,422 A | * | 2/2000 | Ideler | 330/10 |
| 6,133,737 A | | 10/2000 | Greim | 324/318 |
| 6,160,400 A | * | 12/2000 | Friedrich et al. | 324/322 |
| 6,242,918 B1 | * | 6/2001 | Miller et al. | 324/322 |
| 6,384,603 B2 | * | 5/2002 | Hoult et al. | 324/318 |
| 6,437,567 B1 | * | 8/2002 | Schenck et al. | 324/318 |
| 6,535,084 B1 | * | 3/2003 | Tropp | 333/219 |

FOREIGN PATENT DOCUMENTS

EP          1 122 550         8/2001

* cited by examiner

Primary Examiner—Diego Gutierrez
Assistant Examiner—Dixomara Vargas
(74) Attorney, Agent, or Firm—Schiff Hardin & Waite

(57) ABSTRACT

In a MR transmission or reception system with a transmitter or with a receiver provided with a pre-amplifier that is connected to a transmission or reception coil, possibly via mixers and matching elements, at least parts of the transmitter or of the receiver and of the appertaining drive elements are integrated into the transmission or reception coil.

11 Claims, 1 Drawing Sheet

MAGNETIC RESONANCE RESONATOR SYSTEM WITH COIL BRANCHES OPERABLE WITH A TIME-DELAY RELATIVE TO EACH OTHER

BACKGROUND OF THE INVENTION

1. Field of the Invention

The present invention is directed to a MR transmission or reception system (MR resonator system) with a transmitter or with a receiver provided with a pre-amplifier that is connected to a transmission or reception coil, possibly via mixers and matching elements.

2. Description of the Prior Art

Known transmitter assemblies (the same is true for known reception assemblies) for MR systems are composed of a transmitter, transmission and matching elements and the transmission coil. Two matching elements are required that transform the transmission energy from the transmitter output impedance on to the characteristic impedance of the transmission channel and, from the latter, to the impedance of the (resonant) transmission coil. A high radio-frequency energy density occurs in the transmission elements. Moreover, an individual drive of the individual coil elements is possible only with high component outlay.

SUMMARY OF THE INVENTION

An object of the present invention is to design an MR transmission or reception (resonator) system of the type initially described wherein the difficulties with the matchings of the transmission or reception coil are avoided with a simple structure and such that a simple, individual drive of the individual coil elements is possible.

This object is inventively achieved in an MR transmission or reception system wherein at least parts of the transmitter or receiver and of the appertaining drive elements are integrated into the transmission or reception coil. As a result of this integration of the transmitter or the receiver into the coil, the matching and transmission elements, including the transmission cable and the transformation elements for impedance matching to the coils, are largely or entirely eliminated. Moreover, difficulties associated with an excessively high radio-frequency energy density in the transmission elements no longer occur due to their elimination.

In an embodiment of the invention, together with the integration of the transmitter or of the receiver into the coil, the transmitter is split into a number of modules integrated into the coil branches. This not only makes the system symmetrical but also enables an individual drive of the individual coil elements.

The individual coil branches can be digitally drivable, and the switch elements driving the individual coil branches should be capable of being driven time-delayed, so that, for example, a magnetic rotating field can be achieved in the target volume of the coil (circular polarization).

In order to achieve the delay, in an embodiment of the invention the analog delay elements are inserted either into the drive lines of the individual coil branches or digital delay devices are inserted into the drive lines of the individual coil branches, these being fashioned, for example, as shift registers.

For reducing the switching losses, in another embodiment of the invention the individual coil branches can be operated half-resonant (i.e. resonant with low quality, whereby each half-wave or full-wave is individually influenced). In this context it is expedient for the switch elements driving the individual coil branches to switch at the zero-axis crossing of the voltage or of the current (zero voltage switches ZVS or zero current switches ZCS).

For modulating the transmission power, the supply voltage can be modulated, such s with pulse-width modulation or a resonant packet control, i.e. bursts of half-waves.

The individual coil branches as noted above can be driven separately or differently in order, for example, to improve the B1 homogeneity or in order to spatially focus the target field (for example, SAR reduction, i.e. reduction of the specific absorption rate of the patient in order to avoid overheating due to the RF energy).

Although the application of the invention to transmission coils is specifically discussed above, analogous integration and design apply to reception coils with inventively integrated receivers.

DESCRIPTION OF THE PREFERRED EMBODIMENTS

The exemplary embodiments relate to a magnetic resonance tomography apparatus for medical imaging and in general to an MR system with a transmission system and/or reception system.

Figure 1:
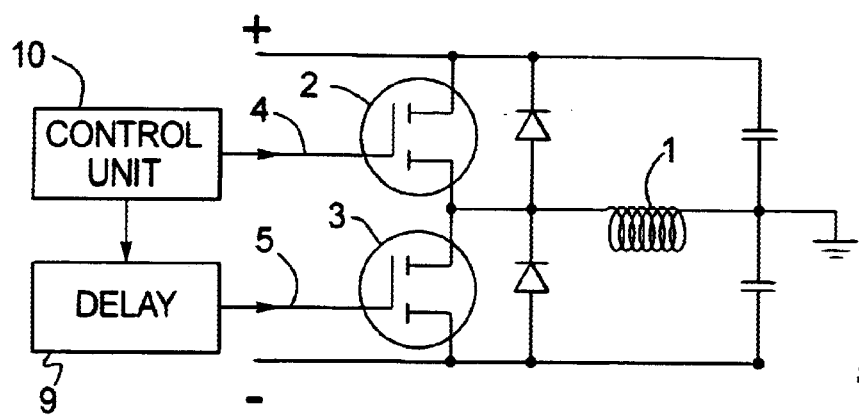
FIG. 1 is a circuit diagram of a transmission coil with an integrated transmitter, wherein a push-pull half-bridge is provided for driving the respective transmission coil branches.

For driving the antenna conductor 1 of a transmission coil (the same is true for the design of a reception coil), a push-pull half-bridge is provided in the arrangement of FIG. 1. The switch elements 2 and 3 are fashioned, for example, as field effect transistors or the like and are driven by a modulated supply voltage that is applied to the switch inputs 4 and 5. As a result, a connection of the positive or negative voltage via the antenna conductor to ground, and thus a targeted drive of such an antenna conductor of a transmission coil, is accomplished. A modification of the push-pull half-bridge provided in the exemplary embodiment of FIG. 1 is the use of a zero current switch shown in the exemplary embodiment of FIG. 2, wherein a disconnect occurs at the zero-axis crossing of the current of the resonant circuit LC.

Figure 2:
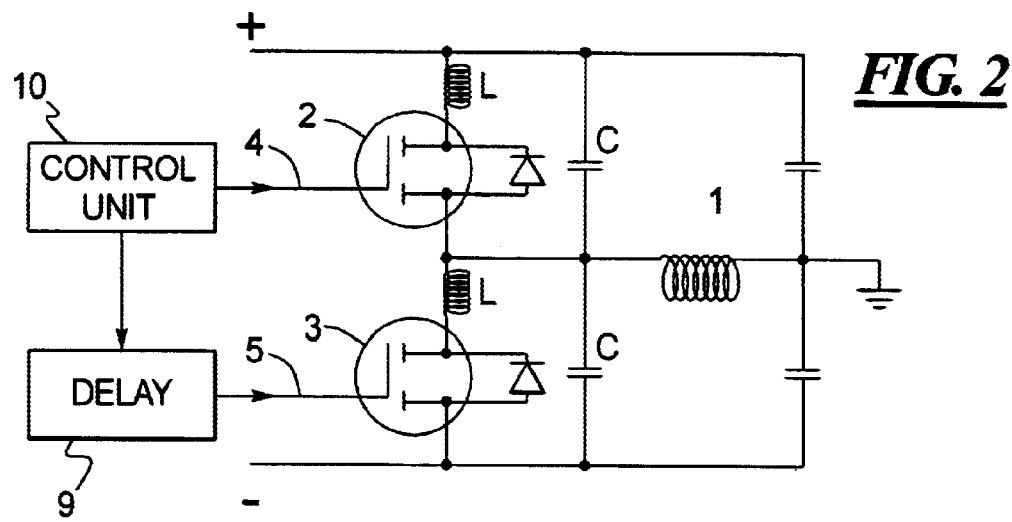
FIG. 2 is a modified exemplary embodiment for a transmission coil having a quasi-resonant switch (zero current switch).
Figure 3:
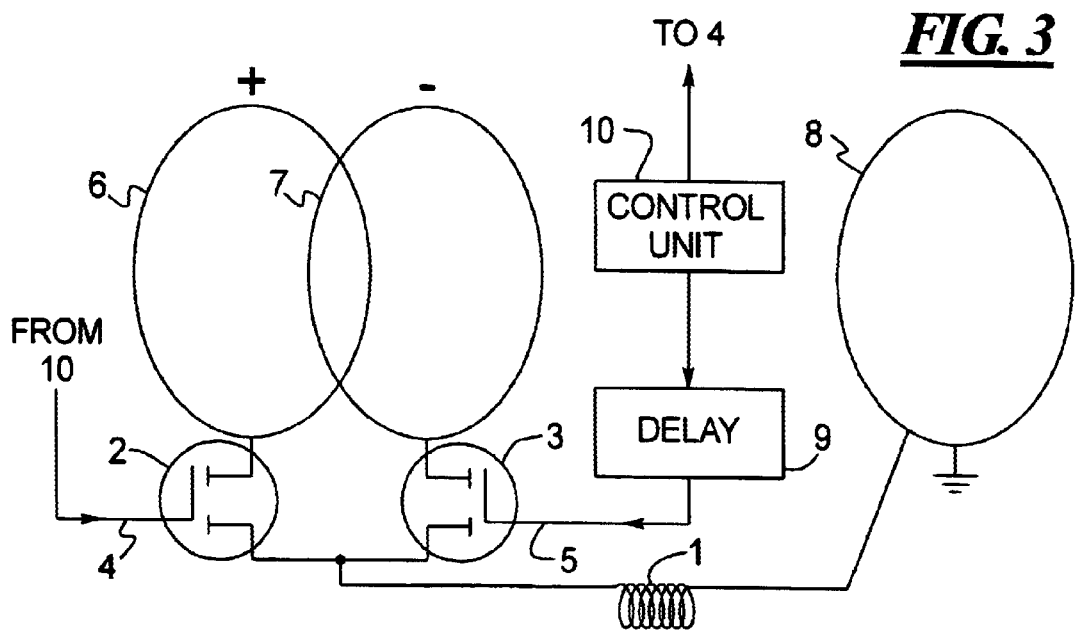
FIG. 3 schematically illustrates the structure of a bird cage coil having positive and negative input rings at one coil end and a grounding ring at the other coil end, with only one of the antenna conductors being distributed equidistantly between them over the circumference of the rings being shown with the corresponding, integrated switch elements for creating an active MR transmission coil.

FIG. 3 schematically shows a bird cage coil with the positive and negative input rings 6 and 7 and the grounding ring 8, that are connected to one another by a number of antenna conductors 1 that are arranged equidistantly distributed around the circumference of the rings 6, 7 and 8. The fashioning of the switches for integrating the transmitter in the form of individual modules into the transmission coil or reception coil can also be realized according to FIG. 2 or, as warranted, in some other way in a departure from the embodiment shown in FIG. 3.

As shown in each of FIGS. 1, 2 and 3, the switch elements 2 and 3 are operated by a control unit 10. A delay element 9 is connected in one of the switch inputs 4 or 5 so that, as described above, the individual coil branches are driven with a time-delay relative to each other. The delay element 9 can be connected in either of the switch inputs 4 and 5, and is shown connected in the switch input 5 in FIGS. 1, 2 and 3, as an example.

Although modifications and changes may be suggested by those skilled in the art, it is in the intention of the inventor to embody within the patent warranted hereon all changes and modifications as reasonably and properly come within the scope of the inventor's contribution to the art.

I claim as my invention:

1. A magnetic resonance resonator system comprising:

a resonator coil selected from the group consisting of a transmission coil and a reception coil, said resonator coil comprising a plurality of coil branches;

a resonator circuit selected from the group consisting of a transmitter and a receiver, connected to said resonator coil and comprising a plurality of coil branches; and said resonator circuit comprising a plurality of modules respectively integrated into the coil branches, each including a pre-amplifier and drive elements, for driving the respective coil branches, including switch elements for driving the respective coil with a time-delay relative to each other.

2. A magnetic resonance resonator system as claimed in claim 1 wherein each of said modules includes digital drive elements for digitally driving said coil branches.

3. A magnetic resonance resonator system as claimed in claim 1 wherein said modules in said resonator circuit include analog delay elements connected into drive lines leading respectively to said coil branches.

4. A magnetic resonance resonator system as claimed in claim 1 wherein said modules include digital delay elements connected to drive lines respectively leading to said coil branches.

5. A magnetic resonance resonator system as claimed in 4 wherein said digital delay elements are shift registers.

6. A magnetic resonance resonator system as claimed in 1 wherein said coil branches are operable in a half-resonant manner by said resonator circuit.

7. A magnetic resonance resonator system as claimed in claim 6 wherein said switch elements switch at a zero-axis crossing of a voltage associated with said resonator coil.

8. A magnetic resonance resonator system as claimed in 8 wherein said switch elements switch at a zero-axis crossing of a current associated with said resonator coil.

9. A magnetic resonance resonator system as claimed in claim 1 wherein said resonator circuit is a transmitter and said resonator coil is a transmission coil, and wherein said transmitter is supplied with a supply voltage, said transmitter modulating said supply voltage for modulating a transmission power of said transmission coil.

10. A magnetic resonance resonator system as claimed in claim 9 wherein said transmitter modulates aid supply voltage with pulse-width modulation.

11. A magnetic resonance resonator system as claimed in claim 9 wherein said transmitter modulates aid supply voltage by a resonant packet control.

* * * * *